US009589769B2

(12) United States Patent
Venugopal et al.

(10) Patent No.: US 9,589,769 B2
(45) Date of Patent: Mar. 7, 2017

(54) APPARATUS AND METHOD FOR EFFICIENT MATERIALS USE DURING SUBSTRATE PROCESSING

(71) Applicant: Varian Semiconductor Equipment Associates, Inc., Gloucester, MA (US)

(72) Inventors: Vijayakumar C. Venugopal, Berkeley, CA (US); Richard J. Hertel, Boxford, MA (US); Vikram Singh, North Andover, MA (US); Ernest E. Allen, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/464,175

(22) Filed: Aug. 20, 2014

(65) Prior Publication Data

US 2016/0013030 A1    Jan. 14, 2016

Related U.S. Application Data

(60) Provisional application No. 62/022,270, filed on Jul. 9, 2014.

(51) Int. Cl.
  *C23C 14/00* (2006.01)
  *H01J 37/32* (2006.01)

(52) U.S. Cl.
  CPC .. *H01J 37/32082* (2013.01); *H01J 37/32357* (2013.01); *H01J 37/32623* (2013.01)

(58) Field of Classification Search
  CPC ........... H01J 37/32082; H01J 37/32357; H01J 37/32623

USPC ........... 216/17, 66; 438/513, 710, 712, 961; 156/345.43, 345.24, 345.35, 345.39, 156/345.48, 345.51; 204/192.34, 192.25, 204/192.35, 298.34, 298.35, 298.36; 118/723 FE, 723 FI

See application file for complete search history.

(56) References Cited

U.S. PATENT DOCUMENTS

| | | | |
|---|---|---|---|
| 6,190,511 B1* | 2/2001 | Wei | C23C 14/0036 204/192.11 |
| 6,423,175 B1* | 7/2002 | Huang | H01J 37/32642 156/345.51 |
| 2008/0132046 A1* | 6/2008 | Walther | H01J 37/08 438/513 |
| 2008/0317968 A1* | 12/2008 | Singh | C23C 14/48 427/523 |
| 2010/0255665 A1* | 10/2010 | Godet | H01J 37/32623 438/513 |
| 2011/0186749 A1* | 8/2011 | Godet | H01J 27/08 250/424 |
| 2012/0248328 A1* | 10/2012 | Renau | H01J 27/024 250/398 |
| 2014/0051253 A1* | 2/2014 | Guha | H01J 37/321 438/710 |

(Continued)

*Primary Examiner* — Nadine Norton
*Assistant Examiner* — Christopher Remavege

(57) ABSTRACT

A processing apparatus may include a plasma chamber to house a plasma; and an extraction assembly disposed along a side of the plasma chamber. The extraction assembly may be configured to direct ions from the plasma to a substrate, wherein the ions generate etched species comprising material that is etched from the substrate; and wherein the extraction assembly comprises at least one component having a recess that faces the substrate and is configured to intercept and retain the etched species.

13 Claims, 7 Drawing Sheets

(56) References Cited

U.S. PATENT DOCUMENTS

| | | | |
|---|---|---|---|
| 2014/0256121 A1* | 9/2014 | Radovanov | H01L 21/2658 438/513 |
| 2015/0179409 A1* | 6/2015 | Biloiu | H01J 37/32357 216/66 |
| 2016/0005594 A1* | 1/2016 | Omstead | C23C 16/45536 438/778 |

* cited by examiner

APPARATUS AND METHOD FOR EFFICIENT MATERIALS USE DURING SUBSTRATE PROCESSING

RELATED APPLICATIONS

This application claims priority to U.S. provisional patent application No. 62/022,270, entitled "Apparatus and method for efficient materials use during substrate processing," filed Jul. 9, 2014, and incorporated by reference herein in its entirety.

FIELD

The present embodiments relate to a processing apparatus and methods of processing substrates, and more particularly, to improved materials recovery during substrate processing.

BACKGROUND

Substrates that are used to fabricate devices such as memory devices, logic devices, other integrated circuit devices, resistors, fuses, microelectromechanical devices, energy conversion devices including solar cells, optical devices, and other components, are often subject to many processes that involve deposition or removal of materials. One issue of concern is the materials cost entailed during substrate processing, which may be impacted by the efficiency of use for a given material for its intended purpose during device fabrication. This may be of special concern when the basic cost of a material used during device fabrication is high.

In one example, during magnetic random access memory (MRAM) fabrication, expensive materials such as platinum and ruthenium may be deposited in layers and patterned to form memory devices. In conventional processing of such MRAM devices, a large fraction of the originally deposited material, such as 30%-40% or more, may be etched and removed from a substrate during formation of a memory device. It may therefore be desirable to reclaim the removed material such as from a manufacturing waste stream after device fabrication to reuse the material in order to reduce operating costs as well as to reduce environmental impact associated with mining of such raw materials.

As noted, conventional apparatus and techniques used to process such wafers including etch processing may not be designed for efficient reclaim of etched material. In particular, conventional inductively coupled plasma (ICP) etch processes used to pattern device structures by plasma or ion beam etching may result in the sputtered materials being dispersed and redeposited over a large area within one or more locations of an apparatus, which may include a variety of different parts or components. In addition, valuable material may be evacuated in the gas phase by pumps that result in condensation of the valuable material outside of a processing apparatus.

These techniques may also rely on in-situ cleaning processes to remove the redeposited material to reduce the frequency of preventive maintenance required for process repeatability and acceptable yield. This, however, places the material into the effluent stream. In some circumstances, hot traps that may be placed downstream of processing apparatus which may aid in recovery of valuable materials that are pumped out of the processing apparatus. This does not, however, help to recover materials remaining on various surfaces within the apparatus including chamber walls and processing components. Recovery of valuable materials from such components may be attempted during an ex-situ cleaning process, which may be cumbersome due to the potentially large number of components to be cleaned and large number of materials that may be deposited on the various components during device processing.

It is with respect to these and other considerations that the present improvements have been needed.

BRIEF SUMMARY

In one embodiment, a processing apparatus may include a plasma chamber to house a plasma; and an extraction assembly disposed along a side of the plasma chamber. The extraction assembly may be configured to direct ions from the plasma to a substrate, wherein the ions generate etched species comprising material that is etched from the substrate; and wherein the extraction assembly comprises at least one component having a recess that faces the substrate and is configured to intercept and retain the etched species.

In another embodiment a method of processing a substrate may include generating a plasma in a plasma chamber; directing ions from the plasma through an extraction aperture of an extraction assembly to a substrate, wherein the ions generate etched species comprising material that is etched from the substrate; and intercepting the etched species on a surface of at least one recess disposed on the extraction assembly and facing the substrate.

In a further embodiment, an extraction assembly may include an extraction plate having an extraction aperture; and a beam blocker disposed adjacent the extraction aperture and interoperative with the extraction aperture to extract a plurality of ion beams from a plasma and to direct the plurality of ion beams to a substrate, wherein the extraction plate comprises an outer surface having a plurality of grooves and the beam blocker comprising a body and at least one elongated recess disposed within the body and facing the substrate, the beam blocker and extraction plate being configured to intercept and condense etched species that are ejected by the plurality of ion beams from the substrate.

DETAILED DESCRIPTION

The embodiments described herein provide apparatus and methods for controlling distribution of etched species during substrate processing. The embodiments include processing apparatus that may direct ions to a substrate to perform etching of the substrate in a manner that causes removal of etched species into the gas phase. Exemplary apparatus include apparatus that generate ions using a plasma in which ions from the plasma may be attracted to the substrate to perform etching of substrate material. In some implementations a processing apparatus may include a plasma chamber to house a plasma, and an adjacent process chamber that houses the substrate. The plasma chamber and process chamber may be coupled to one another via an extraction assembly that extracts ions from the plasma to direct the ions to the substrate.

The present embodiments may be employed to improve efficiency of reclaim of materials that are etched from a substrate during processing. Examples of such materials include precious metals used to form memory devices, such as the aforementioned platinum and ruthenium that may be employed as layers in an MRAM device. However the embodiments are not limited in this context.

Figure 1:
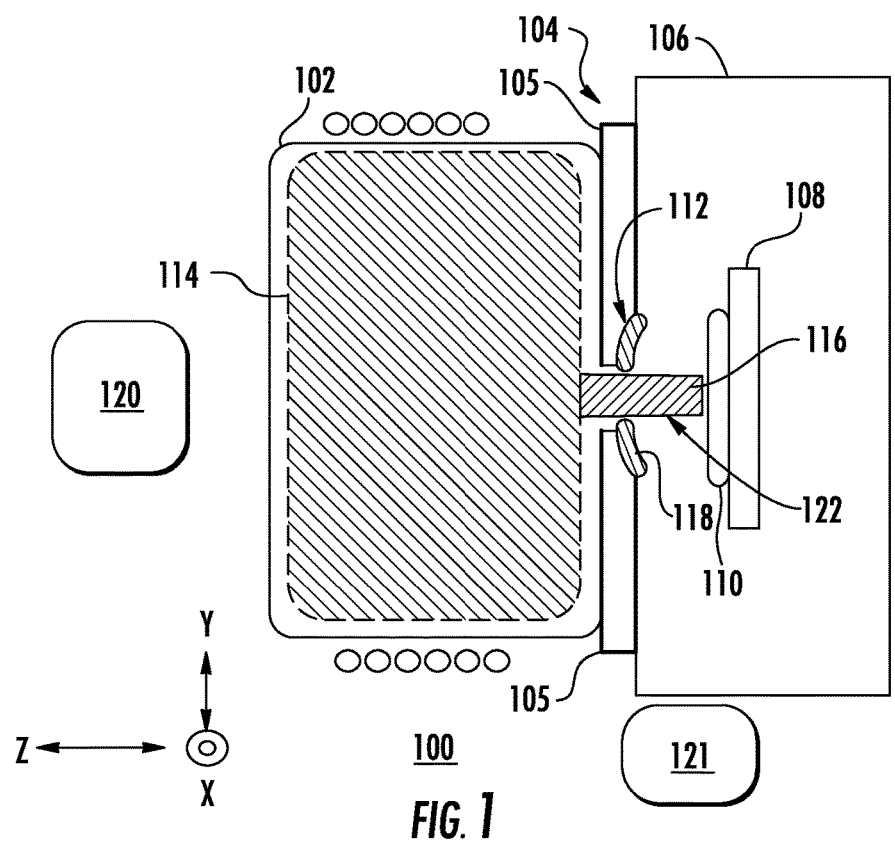
FIG. 1 presents a side view of a processing apparatus according to embodiments of the disclosure.

The present embodiments provide advantages over conventional apparatus that may be used for patterning devices by using ions, for example. As noted, known etching processes and apparatus that have been applied in MRAM device manufacturing are not designed for efficient reclaim of sputtered materials. In many approaches, etching of a substrate layer containing a precious metal such as platinum or ruthenium is performed by physical sputtering to remove that layer. This may be accomplished in conventional plasma apparatus using ions that are directed in a parallel fashion toward the substrate. In order to etch a set of layers to from a structure such as a memory cell, it may be useful to direct the ions at an angle with respect to a sidewall of the memory cell being etched. However, the etched material, which may include precious metals, may be redeposited in various regions of an apparatus that are not amenable for efficient recovery. Another example of processing apparatus used to etch devices such as MRAM devices includes an extraction assembly or extraction plate that extracts ions from a plasma chamber and directs the ions as an ion beam or a set of ion beams to a substrate located in an adjacent chamber. In this type of apparatus, the ion beams may be directed at a controlled ion angular distribution (IAD). The term "ion angular distribution" refers to the mean or average angle of incidence of ions in an ion beam with respect to a reference direction such as a perpendicular to a substrate, as well as to the width of distribution or range of angles of incidence centered around the mean angle, termed "angular spread" for short. The ion angular distribution may involve a mean angle that forms a non-zero angle with respect to a perpendicular to a plane of the substrate. This directing of ions at a non-zero angle may facilitate sputter etching of a sidewall of a device structure, which may extend along a perpendicular to the substrate. The present inventors have recognized that at least some of the sputtered material may redeposit surfaces that are in the vicinity of the substrate being etched including an extraction plate. Accordingly, in various embodiments, components are provided to improve such apparatus or other apparatus to increase recovery of sputtered material. Particular embodiments provide components that improve recovery of redeposited material be novel features designed to enhance collection of material etched from a substrate. This may be especially advantageous for processing of precious metals or other material where reuse or capture may be desired FIG. 1 illustrates a processing apparatus 100 in accordance with various embodiments of the disclosure. Processing apparatus 100 includes a plasma source 120 to generate a plasma 114 in a plasma chamber 102. Plasma source 120 may be an RF plasma source (inductively-coupled plasma (ICP) source, capacitively coupled plasma (CCP) source, helicon source, electron cyclotron resonance (ECR) source), indirectly heated cathode (IHC) source, glow discharge source, or other plasma sources known to those skilled in the art. After a plasma 114 is ignited, the plasma chamber 102 may house the plasma 114 from which ions or other species from plasma chamber 102 may be extracted and provided to an adjacent chamber, processing chamber 106, for processing of a substrate 110. The substrate is supported by a substrate holder 108, which may be at elevated electrical potential (voltage) or may be electrically grounded. Likewise, the plasma chamber 102 may be held at ground potential or at an elevated electrical potential. When a sufficient voltage difference is applied between the plasma chamber 102 and substrate holder 108, ions may be extracted from the plasma chamber 102 and attracted to the substrate 110.

In the example of FIG. 1 an extraction assembly 104 is provided along a side of the plasma chamber 102, which may include an extraction plate 105 that contains at least one extraction aperture 122 through which an ion beam 116 may be directed to the substrate 110. As detailed below, the trajectories of ions in an ion beam such as the ion beam 116 may be adjusted to form a desired ion angular distribution. In particular, the ion beam 116 may be used to perform sputter etching of the substrate in which substrate material is removed by physical sputtering. This type of process may be especially appropriate for removal of materials that have low volatility such that conventional reactive ion etching or similar processes may be ineffective to remove the desired material. Among such materials are the aforementioned platinum and ruthenium. Accordingly, when devices that include such material are to be etched the composition of the ion beam 116 may be tailored for efficient sputter etching. Appropriate gases for generating ions to perform sputter etching may include, for example, inert gas species such as Ar, Xe, and so forth. However, other combinations of gases are possible, including reactive ions.

Because the material that is sputter etched from the substrate 110 may include non-volatile species, at least some of this material may condense when striking solid surfaces that may be located near the substrate 110. As detailed below, the present embodiments provide specially designed components that may increase the collection efficiency of such material, where the collection efficiency may be defined as a ratio of the amount of a given material that is etched from a substrate and redeposited on a given component or set of components in comparison to the total amount of that material that is etched from the substrate. Thus, to illustrate one example, if half of the platinum material that is sputter-etched from a substrate during patterning of a device is redeposited on an extraction plate 105, the collection efficiency of the extraction plate 105 for platinum can be deemed to be 50%. Another manner of stating this scenario is that the extraction plate 105 is configured to condense 50% of the etches species of platinum.

As noted above, in known apparatus used to etch substrates that may employ an extraction plate to form an ion beam, sputtered material may also condense on portions of the extraction plate that form the ion beam. However, such apparatus may not be tailored to improve collection efficiency for a given material such that at least a fraction of the given material condenses elsewhere or is removed from the apparatus. In contrast, various embodiments of the disclosure provide specially tailored features in an extraction assembly to increase collection efficiency and thus increase recovery of material such as precious metals that are etched from a substrate during processing. As shown in FIG. 1, for example, the extraction assembly 104 may include a recess 112 that faces the substrate 110 and is designed to capture additional material that is etched from the substrate 110. This is shown as the deposit 118.

Figure 2A:
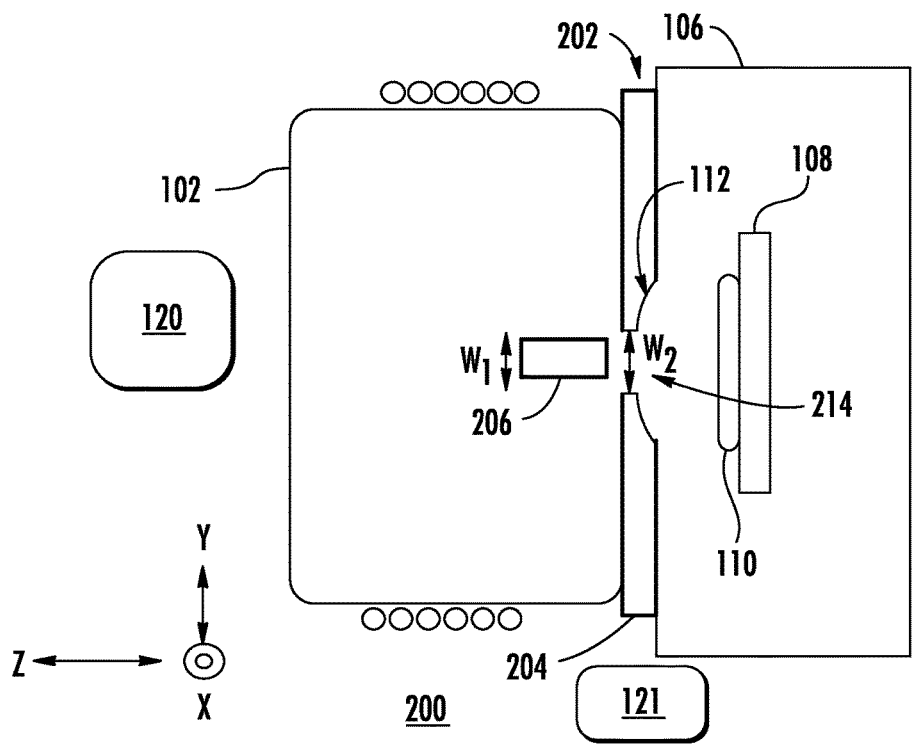
FIG. 2A presents a side view of another processing apparatus according to further embodiments of the disclosure.
Figure 2B:
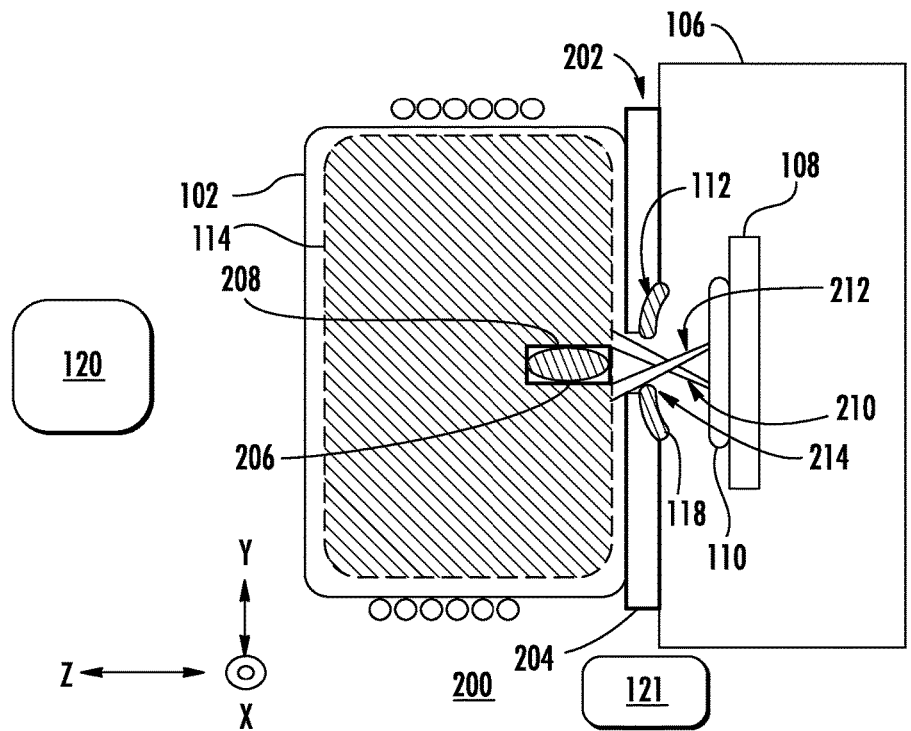
FIG. 2B depicts the processing apparatus of FIG. 2A in one instance of operation.

FIG. 2A depicts a processing apparatus 200 arranged according to further embodiments of the disclosure. FIG. 2B depicts one instance of operation of the processing apparatus 200. The processing apparatus 200 may include similar components to those of processing apparatus 100 described above, which are indicated by like reference numbers. In this example, the processing apparatus 200 includes an extraction assembly 202 that includes an extraction plate 204 that has a planar shape and which may lie in a plane parallel to the X-Y plane of the Cartesian coordinate system shown. In some examples the substrate 110 may also lie in a plane parallel to the X-Y plane during processing. The extraction plate 204 defines an extraction aperture 214 through which ions may be extracted from the plasma 114 and directed to the substrate 110.

Figure 5A:
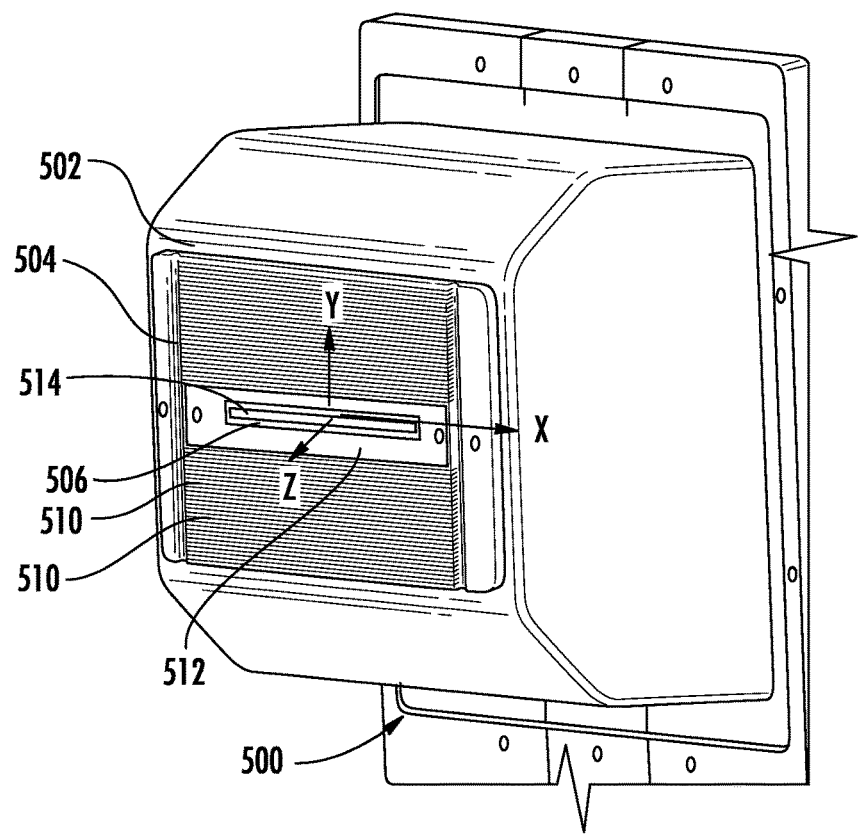
FIG. 5A presents a front perspective view of a portion of a processing apparatus according to still other embodiments of the disclosure.
Figure 5B:
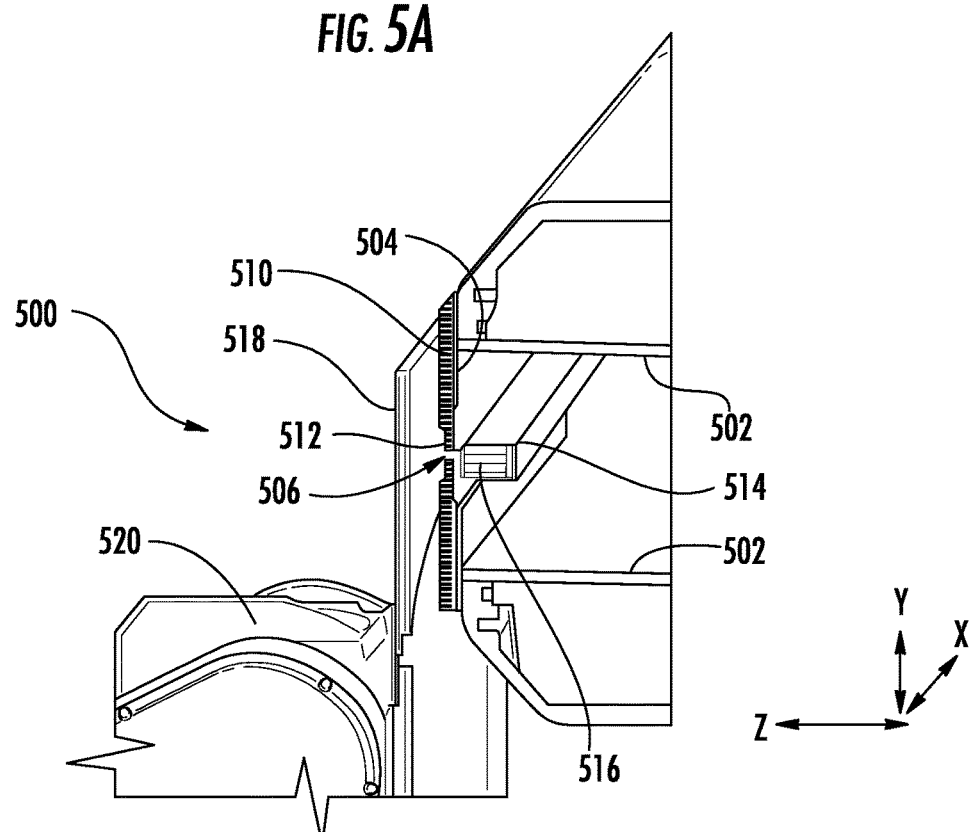
FIG. 5B presents a side cross-sectional perspective view of a portion of the processing apparatus of FIG. 5A.

In this example, the extraction assembly 202 also includes a beam blocker 206 that is disposed on a side of the extraction plate 204 that is opposite a side of the extraction plate 204 facing the substrate 110. For example, as illustrated specifically in FIG. 2, the beam blocker 206 is disposed within the plasma chamber 102. The beam blocker 206 is defined by a body that is disposed adjacent the extraction aperture 214. In some implementations the beam blocker 206 may be elongated along an elongated extraction aperture as illustrated in FIGS. 5A and 5B. The body of the beam blocker 206 may have a rectangular shape or other shape and may be arranged within the plasma chamber 102. As illustrated in FIG. 2B, when the plasma 114 is generated in plasma chamber 102, the beam blocker 206 may be arranged with respect to the extraction aperture 214 in a manner that generates two separate ion beams, ion beam 210 and ion beam 212, when ions are extracted from the plasma 114. In different embodiments the width $w_1$ of beam blocker 206 along a direction parallel to the Y-axis may be equal to the width $w_2$ of the extraction aperture 214, or may be greater than or less than $w_2$. The ion beam 210 and ion beam 212 may be composed of ions whose trajectories lie along directions that define a mean angle that is a non-zero angle with respect to the perpendicular to the plane of the substrate 110. In other words, the mean trajectories of ions in ion beam 210 and ion beam 212 do not lie along the Z-axis. This non-zero trajectory angle may be useful to etch features in the substrate 110, such as memory cell sidewalls that extend along a direction parallel to the Z-axis.

When the ion beam 210 and ion beam 212 impact the substrate 110, material that is sputtered from the substrate 110 may be ejected in a sputter plume (not shown) over a range of sputter angles. The various trajectories of material such as sputtered metal species that is sputter etched from the substrate may be dependent upon the ion angular distribution of the ion beam 210 and ion beam 212 among other factors. Once substrate material is sputter etched from substrate 110, sputtered species of the substrate material such as precious metal atoms that are less volatile may condense upon surfaces that intercept the sputtered species. In the example of FIG. 2, in addition to condensing on a recess 112 in the extraction plate 204 to form the deposit 118, the sputtered species may also traverse the extraction aperture 214 and condense upon surfaces of the beam blocker 206, forming the deposit 208 as shown. By careful design of features within the beam blocker 206 condensation and retention of sputtered species on the extraction assembly 202 may be enhanced such that collection efficiency of the extraction assembly is increased.

Figure 3:
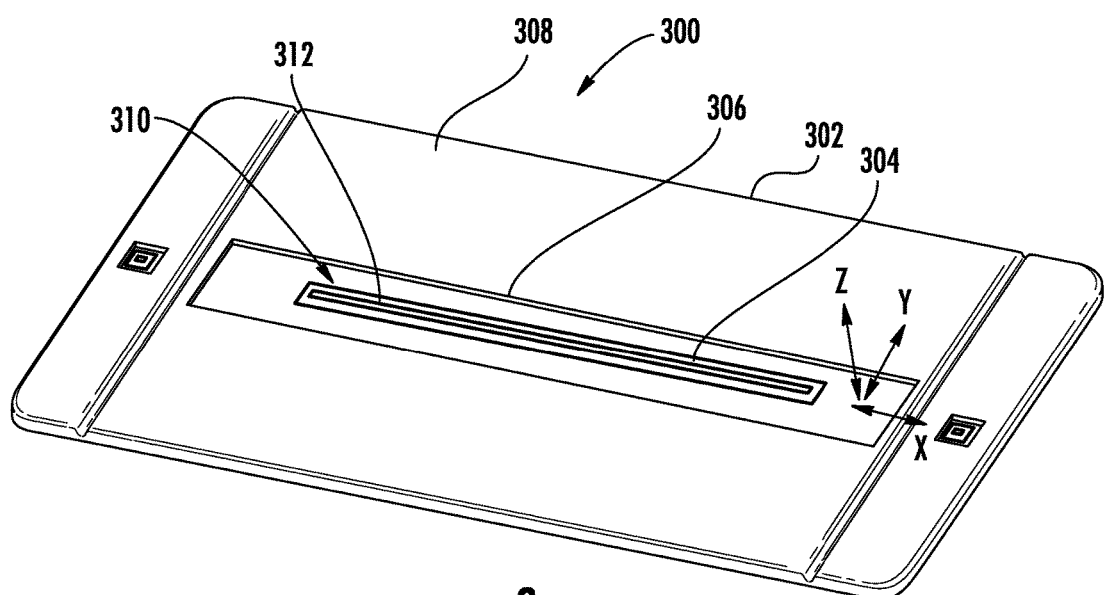
FIG. 3 presents a perspective view of an outside of extraction assembly facing a substrate consistent with other embodiments of the disclosure.

FIG. 3 depicts a perspective view of an extraction assembly 300 according to additional embodiments of the disclosure. When assembled in a processing apparatus, the view shown in FIG. 3 corresponds to that seen from a process chamber that houses a substrate. Thus, the features of extraction assembly 300 that are visible in FIG. 3 may intercept material that is sputtered from a substrate within the processing apparatus. As illustrated, the extraction assembly 300 includes an extraction plate 302 that contains an extraction aperture 304. The extraction aperture 304 may be elongated along a direction parallel to the X-axis as shown. This may be useful to generate an ion beam or ion beam that is elongated so as to impinge on a wide section of a substrate (substrate), which may cover an entire width of a substrate in some instances. In this manner, by scanning the substrate along the Y-axis with respect to the extraction aperture 304 for an appropriate distance, the entire substrate may be treated with ions that exit the extraction aperture 304. However, the embodiments are not limited to this particular shape of the extraction aperture 304.

As noted, the extraction assembly 300 includes several features that may enhance collection efficiency for material sputtered from a substrate that faces the extraction plate 302. These features may also serve to minimize flaking off of deposits after collection, which may increase substrate yield by decreasing potential defects caused when the flaked off deposits land upon the substrate. For one, the extraction plate 302 may include a contour or curved recess, shown as the recess 306 that is configured to collect sputtered material etched from a substrate. The recess 306 may be concave and may exhibit a contour that is tailored to match the shape of a sputter plume of material that is sputtered from a substrate. In other words, an ion beam or ion beams that are extracted through the extraction aperture 304 may generate a sputter plume that is composed of sputtered species ejected over a determined range of sputter angles with respect to the Z-axis. The recess 306 may be accordingly shaped to increase or maximize capture of such sputtered plume based upon range of sputter angles of the sputtered species.

In addition, the extraction plate 302 includes textured features 308, which may include recesses in the shape of grooves or other textured features that are textured to increase surface area that is presented to a plume of sputtered material. In FIG. 3 these are represented as a grooved outer surface as shown.

The extraction assembly 300 also includes a beam blocker 310, which is disposed on an underside of the extraction plate 302 in the view of FIG. 3. As illustrated, a portion of the beam blocker 310 is visible through the extraction aperture 304. The beam blocker 310 may extend along the width of the extraction aperture 304 so as to define multiple elongated beams in a manner illustrated in FIG. 2. The beam blocker 310 includes a plurality of deep recesses 312 which may extend along the beam blocker 310 and may provide more surface area to condense and capture material that is sputtered from a substrate and ejected through the extraction aperture 304.

Referring again to FIGS. 1 and 2, in some implementations, a cooling unit 121 may enhance the collection efficiency by providing localized cooling to an extraction assembly and in particular to surfaces that may intercept sputtered material, such as portions of the extraction assembly 300 including the extraction plate 302 and beam blocker 310. In addition a preferential draw may be maintained in a direction of a preferred redeposition surface to capture sputtered material. This could be achieved, for example, by contouring the pumping path and the shape of the extraction plate at the edges so as to channel the sputtered species largely to the extraction plate.

In various embodiments, an extraction assembly may be configured for convenient removal from a processing apparatus to facilitate cleaning and recycling of desired material, such as precious metals, which may be captured by the extraction assembly. In particular embodiments, an extraction plate may be fabricated from a material that facilitates recycling of material condensed on the extraction plate. For example, it may be convenient to fabricate an extraction plate from a relatively less expensive material. While conventional inductively coupled plasma (ICP) etch processing apparatus may include relatively expensive yttria-coated anodized aluminum parts, it may be advantageous to fabricate an extraction assembly consistent with the present embodiments using less expensive material such as fused quartz. In such cases, because of lower cost, an extraction plate may be discarded at the time of cleaning to reclaim materials or may be replaced more frequently after a desired number of materials reclamation cleaning events have taken place.

For example, in one embodiment, a reclaim process involves removing the extraction assembly including an extraction plate and beam blocker at the end of a scheduled maintenance cycle and subjecting the extraction assembly to a sequence of operations. These operations may include removing redeposited material from the extraction plate, which may entail chemical etching or mechanical grinding of a surface of the extraction plate. The redeposited material may be separated through a floatation processes.

In addition, after redeposited material is removed from an extraction assembly, the individual components of a redeposited material may be separated through a sequence of operations that involve isolation of one particular metal or other element at a time. For example, in the case of reclaiming redeposited material from an extraction assembly after patterning an MRAM device that includes platinum and ruthenium layers, in one operation platinum may be removed from a material mixture by dissolution in hot aqua regia (nitric acid/hydrochloric acid) solution, such that the remaining metals are separated out as a residue. This operation may be followed by removing the nitric acid in the aqua region solution through a sequence of evaporation operations together with the addition of hydrochloric acid to the solution. The platinum may then be precipitated out from the new solution as platinum hexachloride by addition of ammonium chloride. Finally, this residue can then be reduced to platinum by heating in a porcelain glazed dish at low temperature.

As an example of a process to separate ruthenium from the redeposited mixture, firstly the residue may be fused with potassium hydroxide and potassium nitrate, followed by addition of hot distilled water. This yields a solution of $KRuO_4$. This material may be oxidized at boiling point using chlorine gas to obtain $RuO_4$ in gaseous form. To reduce this gas to Ru metal, the gas may be treated with HCl, followed by ignition in hydrogen. However, the embodiments are not limited in this context. The specific sequence of operations involved in the separation process may be dictated by the exact composition of materials that are redeposited on the extraction assembly.

In various embodiments as detailed below, extraction apparatus that have a recess or recesses are configured to generate a plurality of ion beams wherein the plurality of ion beams are configured to generate etched species as a plurality of sputter plumes over a determined range of sputter angles. In these embodiments as detailed below the recess or recess may be tailored according to the determined range of sputter angles of the plurality of sputter plumes.

Figure 4A:
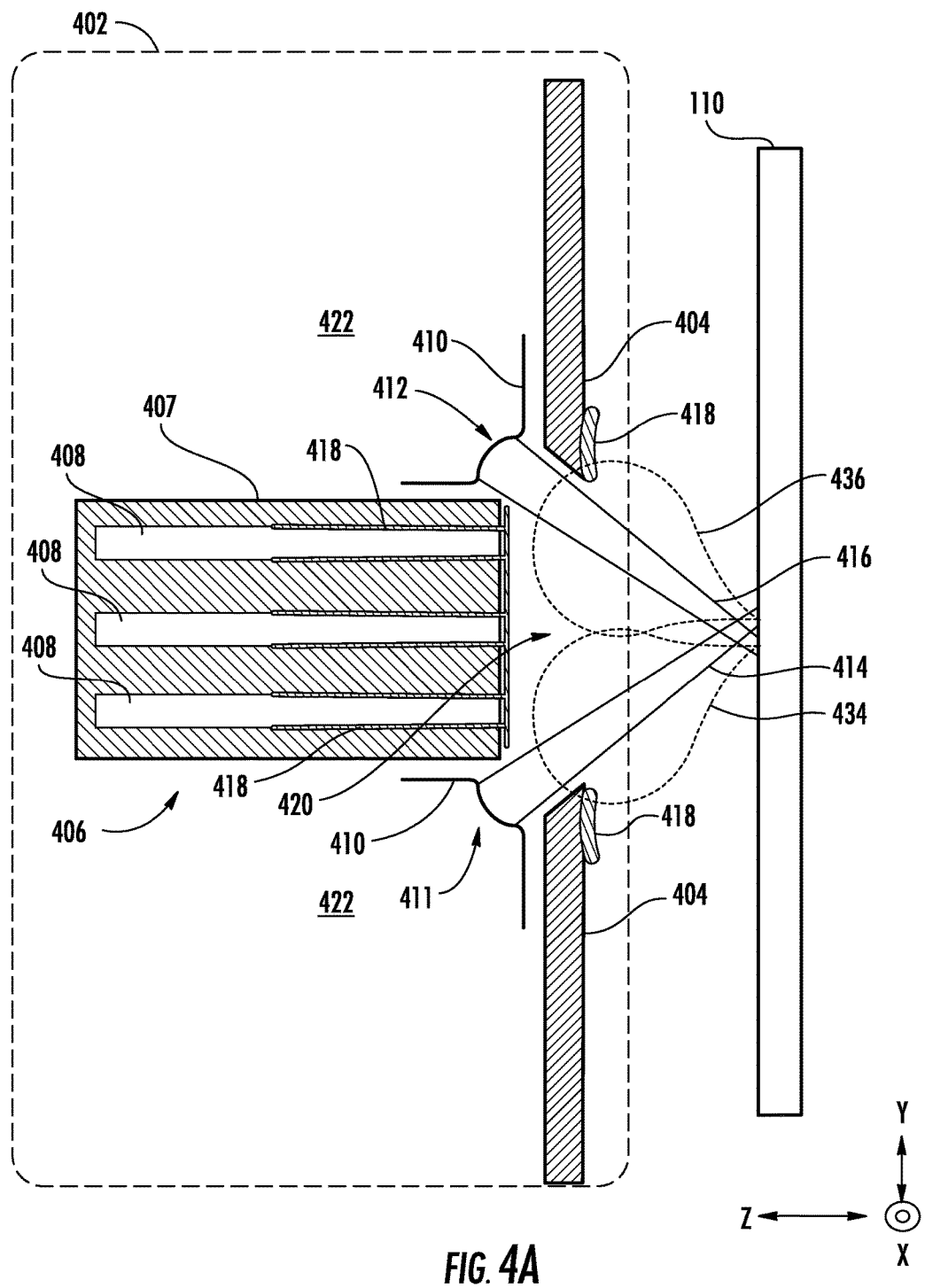
FIG. 4A depicts a side view of an extraction assembly during operation according to additional embodiments of the disclosure.

FIG. 4A depicts a side view of an extraction assembly 402 during operation according to additional embodiments of the disclosure. The extraction assembly 402 includes an extraction plate 404 and beam blocker 406. The extraction plate 404 defines an extraction aperture 420 through which ions may be extracted from the plasma 422 and provided to the substrate 110. When the plasma 422 is generated in a plasma chamber (not shown) the extraction assembly 402 is configured to direct a pair of ion beams, ion beam 414 and ion beam 416, to the substrate 110. As illustrated, the beam blocker 406 is positioned with respect to the extraction aperture 420 so that the shape of a plasma sheath boundary 410 is modified adjacent to the extraction plate 404 and beam blocker 406. In particular, a plurality of menisci that represent a portion of the plasma sheath boundary 410 form between the body 407 of the beam blocker 406 and portions of the extraction plate 404 that are disposed on opposite sides of the extraction aperture 420. These are shown as the shown as a meniscus 411 and meniscus 412.

When a suitable voltage is applied between the plasma 422 and substrate 110, the meniscus 411 generates an ion beam 414, while the meniscus 412 generates the ion beam 416. Both of these ion beams may form a non-zero angle with respect to the Z-axis and may cause ejection of sputtered material from the substrate 110. The sputtered material may be ejected as a sputter plume that may be intercepted by various surfaces in proximity to the substrate 110. As noted, the location at which sputtered material may be intercepted by a solid surface may depend upon the ion angular distribution of ions in the sputter plume. In the example of FIG. 4A, sputtered species that are ejected from substrate 110 by ion beam 414 are illustrated as a sputter plume 434, while sputtered species that are ejected from substrate 110 by ion beam 416 are illustrated as a sputter plume 436. As illustrated, a portion of the sputtered plume 434 and sputter plume 436 are intercepted by the extraction plate 404. Thus, a deposit 418 may collect on a surface of the extraction plate 404 that is formed by intercepting a portion of species in a respective sputter plume. However, as further shown in FIG. 4A, additional sputtered material from sputter plume may be directed along trajectories that pass through the extraction aperture 420. In the embodiment of FIG. 4A, the body 407 of beam blocker 406 is elongated along the Z-axis and includes elongated recesses 408 that are arranged to capture sputtered material that is etched from the substrate 110 and passes through the extraction aperture 420. The resputtered material that is captured by the beam blocker 406 is also shown as deposit 418. The elongated recesses 408 may tend to capture and retain a greater fraction of sputtered material that is incident upon the beam blocker 406 than is captured by a planar surface. In the latter case, a greater fraction of resputtered material that is incident upon the planar surface may be reflected and subsequently transported to other locations in a processing apparatus that may be less convenient to clean. Thus, the configuration of the extraction assembly 402 may provide increased collection efficiency in comparison to conventional plasma or ion beam etching equipment that employs extraction plates. In some examples the collection efficiency may be increased to above 70%, and in particular examples may be increased to at least 80%.

It is to be noted that because the embodiments in which a beam blocker includes elongated recesses 408 may increase the effective surface area for condensing a sputtered species as compared to a beam blocker having a flat planar surface, a larger amount of material may be deposited within the beam blocker 406 before the thickness of the deposited material reaches a given level. Thus, the present embodiments provide an additional advantage in that the frequency of cleaning of extraction assembly parts may be reduced, as well as the likelihood of defect creation in a substrate caused by flaking of material that is redeposited on a beam blocker. In addition, the shape, size, and orientation of elongated recesses 408 may be tailored to match the geometry of a sputtered plume, such as the sputtered plume 434 and sputtered plume 436. For example, if a maximum number of sputtered species are ejected at an angle of 20 degrees with respect to the Z-axis, the long axis of elongated recesses 408 may be oriented at an angle with respect to the Z-axis rather than along the Z-axis as generally shown in FIG. 4A.

Figure 4B:
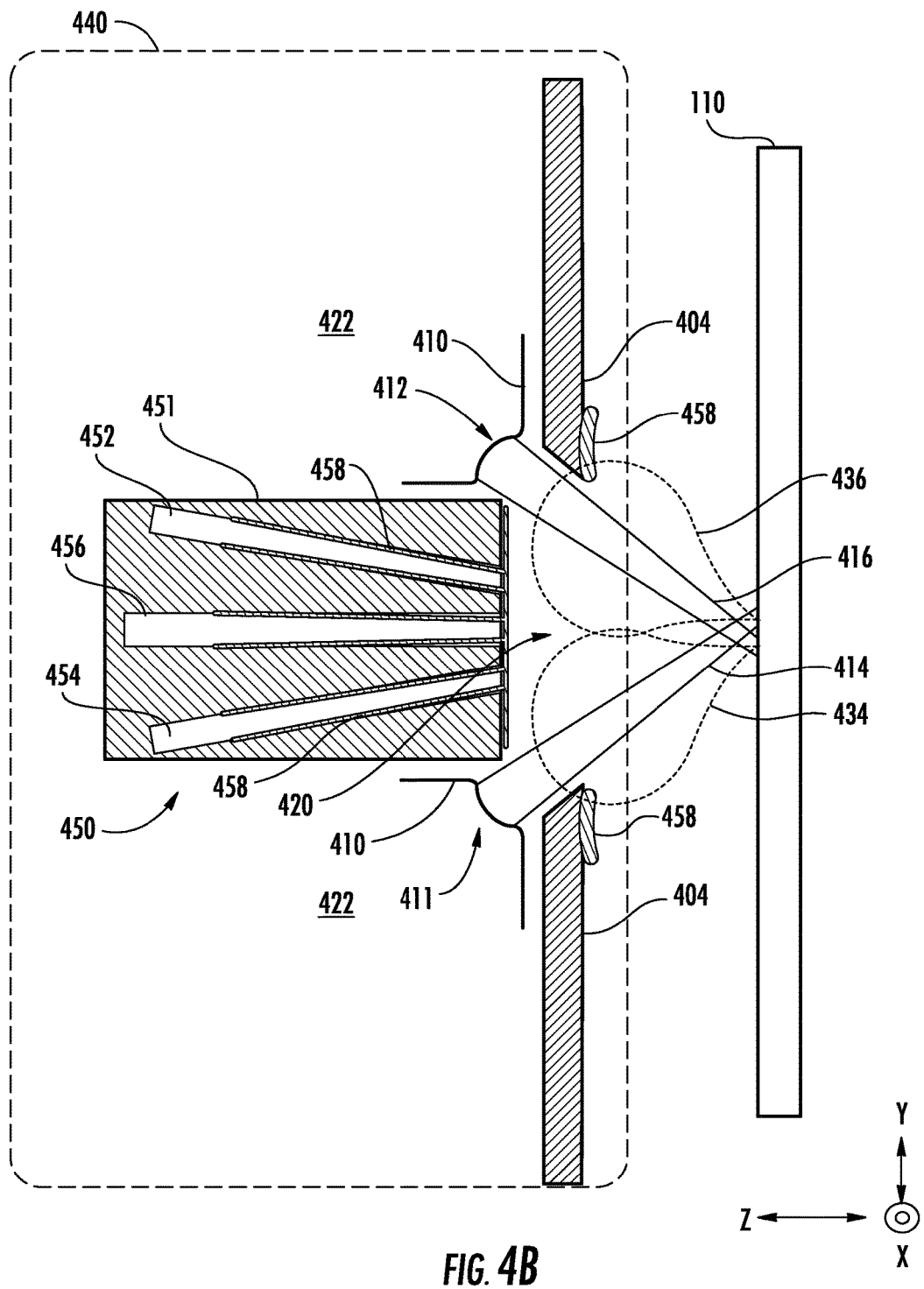
FIG. 4B depicts a side view of another extraction assembly during operation according to additional embodiments of the disclosure.

FIG. 4B depicts a side view of another extraction assembly 440 during operation according to additional embodiments of the disclosure. The extraction assembly 440 may have components in common with the extraction assembly 402, which are labeled with the same reference numbers. However, in this embodiment, the extraction assembly 440 includes a beam blocker 450 that includes elongated recesses within a body 451 of the beam blocker. As illustrated, elongated recesses in the body 451 have their long axes oriented along directions that form a non-zero angle with respect to the Z-axis. These are illustrated in particular as the elongated recess 452 and elongated recess 454, in addition to an elongated recess 456, which may be oriented parallel to the Z-axis. In this beam blocker, the elongated recess 452, elongated recess 454, and elongated recess 456 may more efficiently capture sputtered species by matching the geometry of a sputtered plume, such as the sputtered plume 434 and sputtered plume 436. In particular, because the sputter plume 434 and sputter plume 436 individually or collectively may generate sputtered species over a range of sputter angles some of which are not oriented along the Z-axis, it may be more efficient to provide at least some elongated apertures that are tailored to better align with angles of the sputtered species. The elongated recess 452, elongated recess 454, and elongated recess 456 may have their long axes that are oriented according to the range of sputter angles of the sputtered species of the sputter plume 436. For example, if a maximum number of sputtered species are ejected at a sputter angle of +/−20 degrees with respect to the Z-axis in the respective sputter plume 434 and sputter plume 436, the long axis of elongated recess 452 and elongated recess 454 may likewise be oriented at + degrees and −20 degrees with respect to the Z-axis to better collect the sputtered species. This is shown as the deposit 458.

FIG. 5A presents a front perspective view of a portion of a processing apparatus 500 according to still other embodiments of the disclosure. The processing apparatus includes a plasma chamber 502 and extraction plate 504 disposed along a side of the plasma chamber 502. The extraction plate 504 includes an extraction aperture 506 through which ions may be extracted toward the left in the view of FIG. 5A. The extraction plate 504 includes a plurality of elongated recesses 510 on an outer side of the extraction plate 504 that may face a substrate (not shown) to be etched. The extraction plate 504 further includes a wide recess 512 that is disposed around the extraction aperture 506.

FIG. 5B presents a side cross-sectional perspective view of a portion of the processing apparatus 500. As illustrated the processing apparatus 500 also includes a beam blocker 514 disposed within the plasma chamber 502 and adjacent the extraction aperture 506. In this embodiment, beam blocker 514 further includes a plurality of elongated recesses 516. The wide recess 512, elongated recesses 510, and elongated recesses 516 may function to increase collection efficiency of sputtered material that is removed from a substrate (not shown) that may be disposed on the substrate holder 518.

Figure 5C:
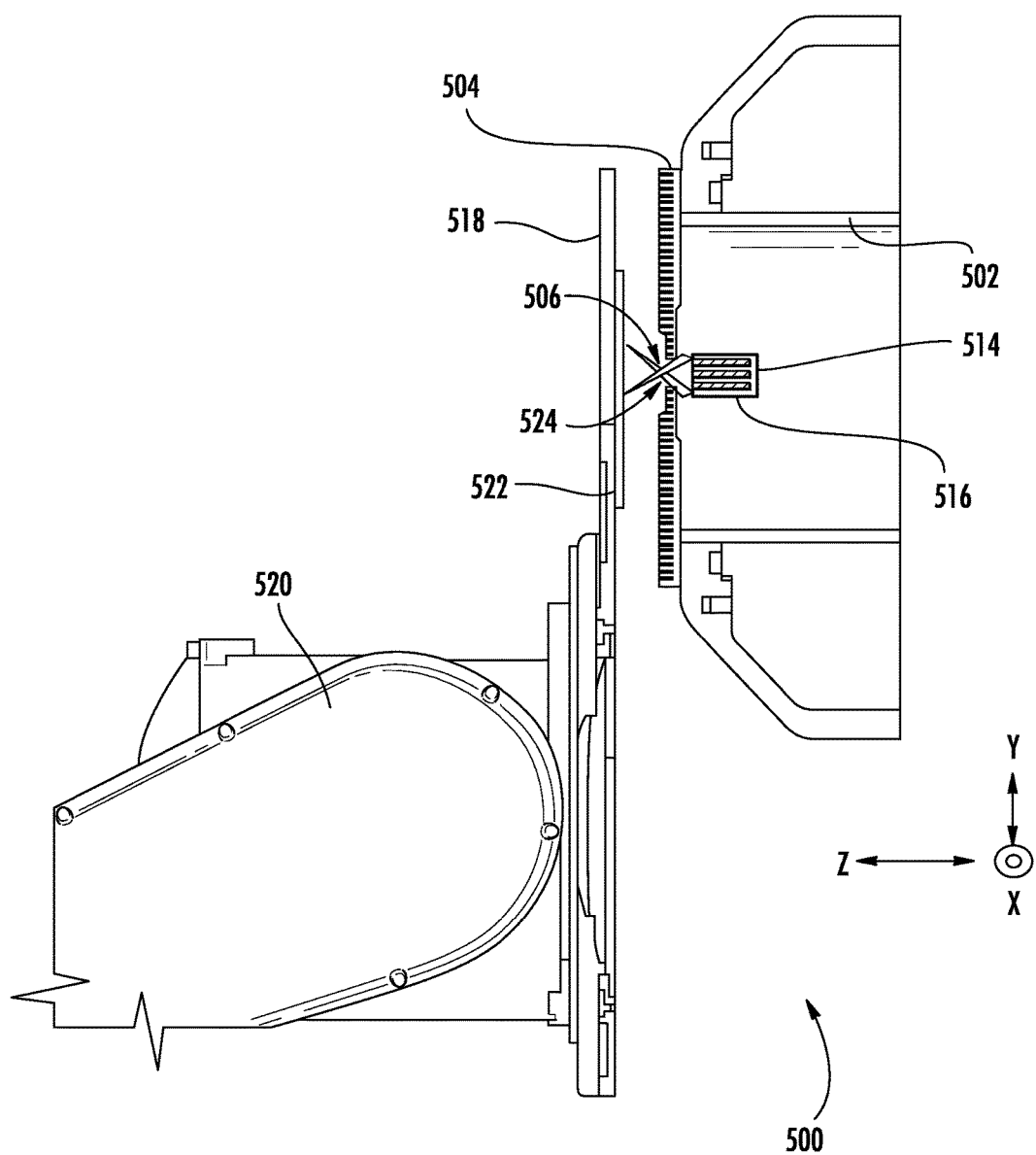
FIG. 5C presents a side cross sectional view of the processing apparatus of FIG. 5A.
Figure 5D:
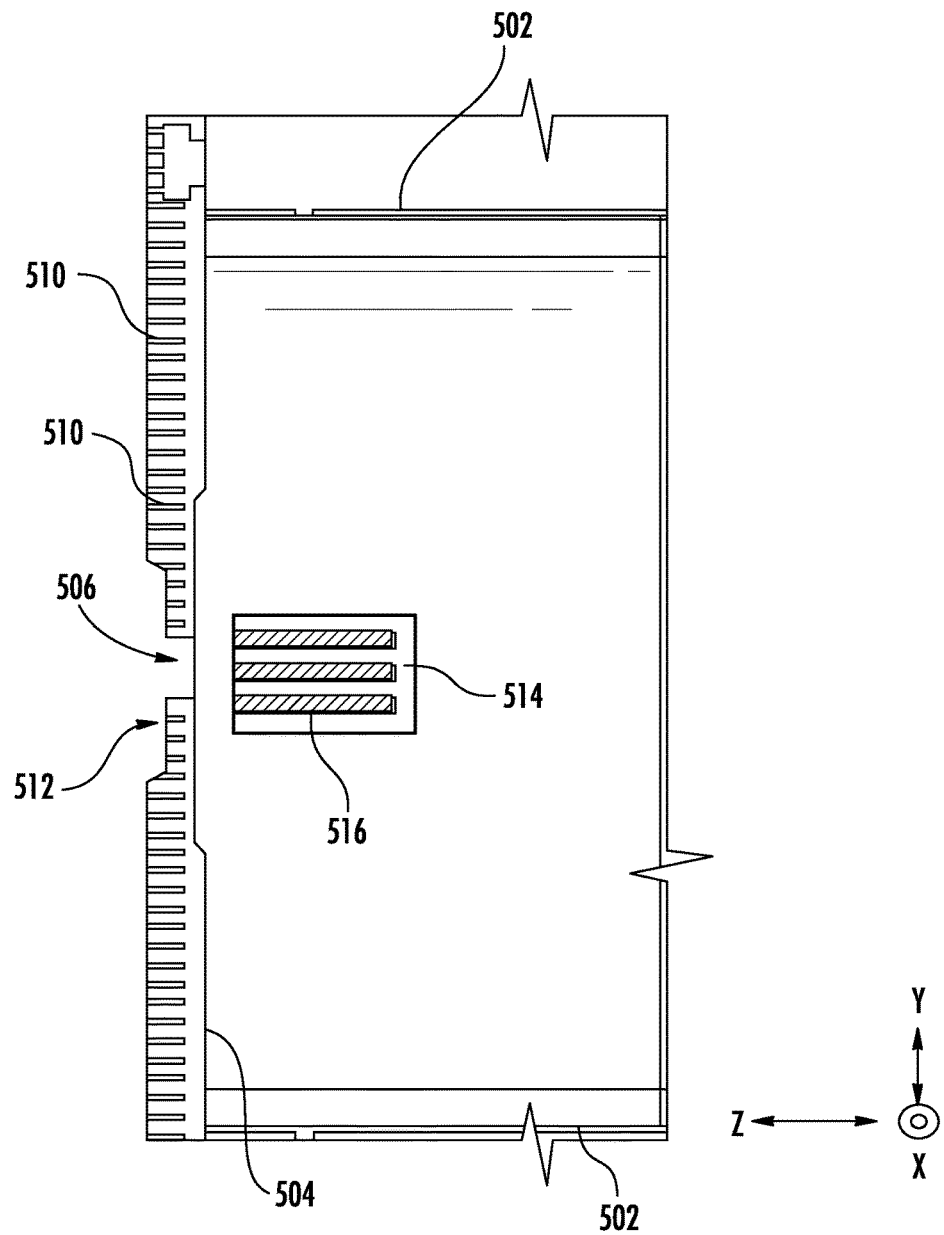
FIG. 5D presents a side cross-sectional view showing more details of an extraction plate and beam blocker.

FIG. 5C presents a side cross sectional view of the processing apparatus 500 while FIG. 5D presents a side cross-sectional view showing more details of the extraction plate 504 and beam blocker 514. As illustrated in FIG. 5C, when the stage 520 scans a substrate 522 next to the extraction aperture 506 ions 524 may strike the substrate 522, and may sputter etch material from the substrate 522, which material may by intercepted by the extraction plate 504 and beam blocker 514. The beam blocker 514 may thus intercept sputtered material that travels through the extraction aperture 506 and may trap the sputtered material in the elongated recesses 516.

In summary, the present embodiments provide multiple advantages in comparison to conventional processing equipment used to etch substrates. The increased collection efficiency afforded by extraction assemblies arranged according to different embodiment may reduce cost of operation by increasing the fraction of precious metals that may be recovered for device fabrication that employs such metals. In addition, productivity may be increased by reducing the frequency of maintenance and generating higher product yield by providing more effective capture of sputtered material. Moreover, the cost of precious metal reclaim processing may be lowered by providing more localized capture on readily cleaned extraction components. The present embodiments also provide improved eco-efficiency through increased reuse of materials, and the concomitant reduction in the use of virgin materials that require energy and resource intensive mining practices.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:
1. A processing apparatus comprising:
a plasma chamber to house a plasma; and an extraction assembly disposed along a side of the plasma chamber, the extraction assembly configured to direct ions from the plasma to a substrate, wherein the ions generate etched species comprising material that is etched from the substrate, and wherein the extraction assembly comprises at least one component having a recess that faces the substrate and is configured to intercept and retain the etched species, wherein the extraction assembly comprises an extraction plate having an extraction aperture and a beam blocker disposed within the plasma chamber and having at least one recess that faces the substrate through the extraction aperture, wherein the beam blocker comprises a plurality of elongated recesses having a long direction that is perpendicular to a plane of the substrate.

2. The processing apparatus of claim 1, wherein the extraction plate comprises a grooved outer surface that faces the substrate.

3. The processing apparatus of claim 1, wherein the beam blocker and extraction aperture are interoperative to generate a plurality of menisci in a plasma sheath boundary of the plasma, wherein a plurality of ion beams are extracted from the plurality of menisci and directed to the substrate, wherein the etched species are generated as a plurality of sputter plumes over a range of sputter angles, and wherein the at least one recess is tailored according to the range of sputter angles of the plurality of sputter plumes.

4. The processing apparatus of claim 1, wherein the extraction plate comprises a curved recess on a surface that faces the substrate and is configured to intercept the etched species.

5. The processing apparatus of claim 4, wherein the ions are configured to generate the etched species as a sputter plume over a determined range of sputter angles, wherein the curved recess is tailored according to the range of sputter angles of the sputter plume.

6. A processing apparatus comprising:
a plasma chamber to house a plasma; and
an extraction assembly disposed along a side of the plasma chamber, the extraction assembly configured to direct ions from the plasma to a substrate, wherein the ions generate etched species comprising material that is etched from the substrate, and wherein the extraction assembly comprises at least one component having a recess that faces the substrate and is configured to intercept and retain the etched species, wherein the extraction assembly comprises an extraction plate having an extraction aperture and a beam blocker disposed within the plasma chamber and having at least one recess that faces the substrate through the extraction aperture, wherein the beam blocker comprises a plurality of elongated recesses having long axes that are oriented at a non-zero angle with respect to a perpendicular to a plane of the substrate.

7. The processing apparatus of claim 1, wherein the extraction plate and beam blocker are configured to condense greater than 70% of the etched species.

8. An extraction assembly, comprising:
an extraction plate having an extraction aperture; and
a beam blocker disposed adjacent the extraction aperture and interoperative with the extraction aperture to extract a plurality of ion beams from a plasma and to direct the plurality of ion beams to a substrate, wherein the extraction plate comprises an outer surface having a plurality of grooves and the beam blocker comprising a body and at least one elongated recess disposed within the body and facing the substrate, the beam blocker and extraction plate being configured to intercept and condense etched species that are ejected by the plurality of ion beams from the substrate, wherein the ions are configured to generate the etched species as a sputter plume over a determined range of sputter angles, wherein the beam blocker comprises a plurality of elongated recesses that have long axes that are oriented according to the range of sputter angles.

9. The extraction assembly of claim 8, further comprising a curved recess disposed on an outer surface of the extraction plate and configured to condense the etched species.

10. The extraction assembly of claim 9, wherein the curved recess is tailored according to the range of sputter angles of the sputter plume.

11. The processing apparatus of claim 6, wherein the extraction plate comprises a curved recess on a surface that faces the substrate and is configured to intercept the etched species.

12. The processing apparatus of claim 11, wherein the ions are configured to generate the etched species as a sputter plume over a determined range of sputter angles, wherein the curved recess is tailored according to the range of sputter angles of the sputter plume.

13. The processing apparatus of claim 6, wherein the extraction plate and beam blocker are configured to condense greater than 70% of the etched species.

* * * * *